US006504448B1

(12) United States Patent
Yip

(10) Patent No.: US 6,504,448 B1
(45) Date of Patent: Jan. 7, 2003

(54) APPARATUS AND METHOD FOR TRANSMISSION LINE IMPEDANCE TUNING USING PERIODIC CAPACITIVE STUBS

(75) Inventor: Wai-Yeung Yip, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 31 days.

(21) Appl. No.: 09/633,961

(22) Filed: Aug. 8, 2000

(51) Int. Cl.[7] .................................................. H03H 7/38

(52) U.S. Cl. ............................ 333/33; 333/34; 333/263

(58) Field of Search ............................ 333/33, 34, 204, 333/205, 263

(56) References Cited

U.S. PATENT DOCUMENTS

| | | | | | |
|---|---|---|---|---|---|
| 3,662,294 A | * | 5/1972 | Jacobs et al. | ................. | 333/33 |
| 3,879,690 A | * | 4/1975 | Golant et al. | ............... | 333/204 |
| 3,959,749 A | * | 5/1976 | Ikushima et al. | ........... | 333/203 |
| 4,157,517 A | * | 6/1979 | Kneisel et al. | .............. | 333/205 |
| 5,023,866 A | * | 6/1991 | De Muro | .................... | 370/278 |
| 6,101,295 A | * | 9/2000 | Mineo et al. | .................. | 385/1 |

* cited by examiner

*Primary Examiner*—Robert Pascal
*Assistant Examiner*—Stephen E. Jones
(74) *Attorney, Agent, or Firm*—Gary S. Williams; Pennie & Edmonds LLP

(57) ABSTRACT

A method of tuning transmission line impedance includes the step of determining a desired impedance for a transmission line. A capacitive stub is periodically added to the transmission line. A physical quantity to be removed from each of the capacitive stubs to achieve the desired impedance is identified. The identified physical quantity is then removed to establish the desired transmission line impedance. A method of forming an impedance bridge includes the step of affixing a set of capacitive stubs to a bridging transmission line that has a first end and a second end. The vertical height of the set of capacitive stubs is tapered from the first end to the second end to form an increasingly high impedance between the first end and the second end.

17 Claims, 3 Drawing Sheets

APPARATUS AND METHOD FOR TRANSMISSION LINE IMPEDANCE TUNING USING PERIODIC CAPACITIVE STUBS

BRIEF DESCRIPTION OF THE INVENTION

The present invention relates generally to transmission line systems in electronic devices. More particularly, the invention relates to a technique for transmission line impedance tuning using periodic capacitive stubs.

BACKGROUND OF THE INVENTION

Electronic devices commonly include a transmission line to route signals to a set of integrated circuits. In such a context, the transmission line may be implemented as a wire on a printed circuit board. A set of such transmission lines forms a bus.

One important design factor for a transmission line is to achieve impedance control within a tight tolerance. Tight impedance control minimizes discontinuities, which in turn minimizes reflection noise, thereby preserving signal quality. Sophisticated techniques are used to design controlled impedance transmission lines in electronic systems. However, once the transmission line is constructed, there are limited techniques available to improve the transmission line's characteristics.

In view of the foregoing, it would be highly desirable to provide a technique for tuning the performance of a transmission line within a fabricated electronic system.

SUMMARY OF THE INVENTION

A method of tuning transmission line impedance includes the step of determining a desired impedance for a transmission line. A set of capacitive stubs is added to the transmission line. A physical quantity to be removed from each of the capacitive stubs to achieve the desired impedance is identified. The identified physical quantity is then removed to establish the desired transmission line impedance.

A method of forming an impedance bridge includes the step of affixing a set of capacitive stubs to a bridging transmission line that has a first end and a second end. The vertical height of the set of capacitive stubs is tapered from the first end to the second end to form an increasingly high impedance between the first end and the second end.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
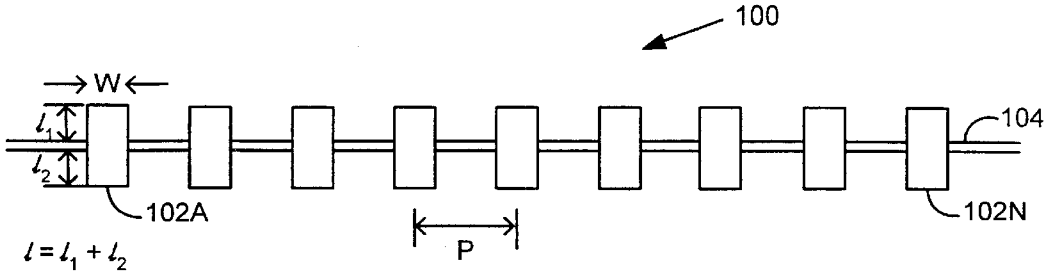
FIG. 1 is a block diagram of a system constructed in accordance with an embodiment of the invention.

FIG. 1 illustrates a system 100 in accordance with an exemplary embodiment of this invention. In the system 100, capacitive stubs, 102A–102N, are added to a transmission line 104. In this embodiment, the capacitive stubs 102A–102N are placed on the transmission line 104 separated by a pitch p. Each capacitive stub 102 has a length "l" (the sum of segments $l_1$ and $l_2$) and a width "w", as indicated in FIG. 1. Preferably, each capacitive stub is a volume of material formed of the same substance as the transmission line 104. If the transmission line is embedded in a laminated printed circuit board, stubs can be attached to the transmission line through vertical vias, which traverse through the printed circuit board and are accessible on the surface of the printed board.

In the system 100, the transmission line 104 is uniform along its length and has an impedance $Z_l$ and a distributed capacitance $C_l$. The capacitive stubs 102A–102N have lumped capacitance $C_s$. The pitch p (i.e., spacing) varies depending on a desired transmission line impedance. In this embodiment, the approximate effective impedance ($Z_e$) of the transmission line 104 having capacitive stubs 102A–102N can be calculated by the following equation:

$$Ze \approx \frac{Z_l}{\sqrt{1 + \frac{Cs}{C_{lp}}}} \quad [1]$$

Typically, the approximation in equation [1] is accurate for a given signal wavelength λ significantly larger than p. In an exemplary embodiment, the relationship between a signal wavelength λ and a pitch p can be represented by the following equation:

$$p \leqq \lambda/10 \quad [2]$$

Additionally, the approximation of equation [1] is accurate generally when dimensions of capacitive stubs 102A–102N are small relative to the signal wavelength λ. In an exemplary embodiment, the relationship between dimensions of capacitive stubs 102A–102N and λ may be represented by the following equations:

$$w \leqq \lambda/10$$

$$l \leqq \lambda/10 \quad [3a]$$

The original stub capacitance $C_{so}$, which represents stub capacitance before any trimming, is a function of the width and length of the stub:

$$C_{so} = C_s(W_o, l_o) \quad [3b]$$

In an exemplary embodiment, the tunable range of the capacitive stubs may be calculated by the following equation:

$$Z_{ll} = \frac{Z_l}{\sqrt{1 + \frac{C_{so}}{C_{lp}}}} \le Z_e \le Z_l \quad [4]$$

As shown in equation [4], the effective impedance ($Z_e$) is generally equal to or less than the transmission line impedance, $Z_l$. Initially, the transmission line impedance, $Z_l$, is designed to correspond to an upper bound. Stubs are added to establish the lower bound, $Z_{ll}$. By trimming the capacitive stubs by the appropriate amount, the effective impedance ($Z_e$) of the system 100 can be tuned to any value between $Z_l$ and $Z_{ll}$. In this exemplary embodiment, two design parameters may be adjusted to vary the tunable range, namely, $C_{so}$ and p. Changes in the value of $C_{so}$ or p correspondingly change the tunable range of $Z_e$. The sensitivity of $Z_{ll}$ to changes in $C_{so}$ and p may be represented by the following equations, the function of capacitance (equation [5a]) and the function of pitch (equation [5b]):

$$\Delta Z_{ll} \approx \frac{Z_l}{2C_l p}\left(1+\frac{C_{so}}{C_l p}\right)^{-\frac{3}{2}}|\Delta C_{so}| \quad [5a]$$

$$\Delta Z_{ll} \approx \frac{Z_l C_{so}}{2C_l p^2}\left(1+\frac{C_{so}}{C_l p}\right)^{-\frac{3}{2}}|\Delta p| \quad [5b]$$

In an exemplary embodiment, fine tuning of transmission line impedance may be achieved by removing physical portions of added capacitive stubs 102A–102N. As portions of capacitive stubs 102A–102N are removed, the effective impedance is reduced by a corresponding amount. In an exemplary embodiment, the value of $C_s$ may be dependent on physical dimensions of capacitive stubs 102A–102N as represented in the following equations, where d represents a dielectric thickness between the capacitive stubs and the underlying ground plane:

$$|\Delta C_s|_{d=constant} \approx \varepsilon\frac{|\Delta w|l + w|\Delta l|}{d} \quad [6]$$

$$|\Delta C_s|_{w,l=constant} \approx \approx \varepsilon\frac{wl}{d^2}|\Delta d| \quad [7]$$

By way of illustration, a 16 device edge bond RAMBUS In-Line Memory Module, from RAMBUS, Inc., Mountain View, Calif., is considered. Assume that $Z_l$=56Ω, p=7.06 mm, $C_1$=130.1 pF/m and d=5 mil. When $C_{so}$ equals 0.215 pF, a tunable range of 10% or 50.4<$Z_e$<56Ω is achieved. Assume FR4 is the printed circuit board material with $\epsilon_r$=4.12. Further assume that the added capacitive stubs have dimensions of w=l=34.07 mil. Under these assumptions, a 1 mil change in either w or l results in a 0.14Ω change in $Z_{ll}$, and a 1 mil change in d results in a 0.96Ω change in $Z_{ll}$.

As shown in the example, the sensitivity of $Z_{ll}$ to variations in the value of d is quite significant compared to the sensitivity of $Z_{ll}$ to variations in the values of w and l. Sensitivity to w and l, which are the trimmable parameters, may be increased by reducing p at the expense of increasing the number of capacitive stubs. For example, when p is reduced by half to 3.53 mm, $C_{so}$ equals 0.108 pF for the same tunable range. If w=l=24.15 mil, a 1 mil change in w or l now results in a 0.20Ω change in $Z_{ll}$. The sensitivity to dimensional tolerance can be designed into the stubs for maximum precision.

Figure 2:
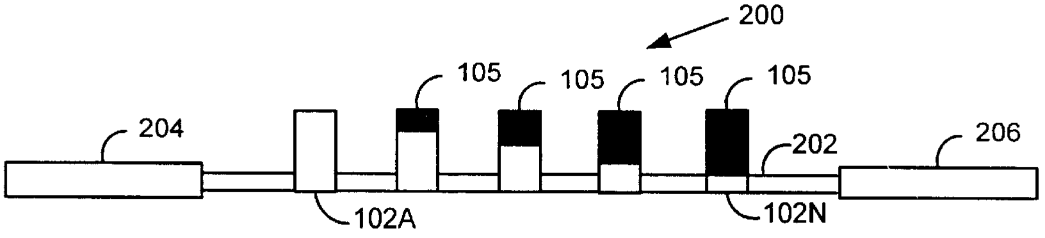
FIG. 2 is a block diagram of an impedance bridge constructed in accordance with an embodiment of the invention.

The technique of the invention may also be used to form an impedance bridge between a low impedance transmission line and a high impedance transmission line. This technique is disclosed in connection with FIG. 2. FIG. 2 illustrates a system 200 with a transmission line 202 connected at one end to a low impedance transmission line 204 and connected at another end to a high impedance transmission line 206. The system 200 also includes a set of capacitive stubs, 102A–102N, added to the transmission line 202. The number of capacitive stubs added to the transmission line and the size of each added capacitive stub may vary depending on a desired impedance to be achieved. In this embodiment, capacitive stubs 102A–102N having substantially the same size are equally spaced from each other. A physical portion of each of the capacitive stubs 102A–102N may be removed such that impedance in the transmission line 202 gradually increases from the end connected to the lower impedance transmission line 204 to the end connected to the higher impedance transmission line 206. The removed portion 105 of each stub 102 is shown in black in FIG. 2. Thus, the transmission line 202 forms an impedance bridge between the low impedance transmission line 204 and the high impedance transmission line 206.

The technique of the invention also includes the operation of measuring the impedance of a transmission line. Individual capacitive stubs are added to the transmission line to provide a tunable range between the original measured impedance and the lower impedance created by the capacitive stubs. Portions of the added capacitive stubs are subsequently removed to achieve the desired impedance.

How many capacitive stubs to add and what amount to trim from the added capacitive stubs may be determined in a number of ways. For example, this determination may be made by calculation, modeling or a repeated measure-and-trim sequence.

Impedance tolerance may also be controlled by adding or removing capacitive stubs. For example, the impedance tolerance of a transmission line as manufactured may be +/−10% of nominal impedance. If an impedance tolerance of +/−5% is desired, capacitive stubs may be selectively placed on the transmission line to offset manufacturing tolerance to +5% to −15%. If the fabricated transmission line is measured to have impedance within—15% to −5% of nominal impedance, capacitive stubs are trimmed to increase transmission line impedance to the desired range of −5% to +5% of the nominal impedance. In this exemplary embodiment, tuning by trimming may be done in one step.

Figure 3:
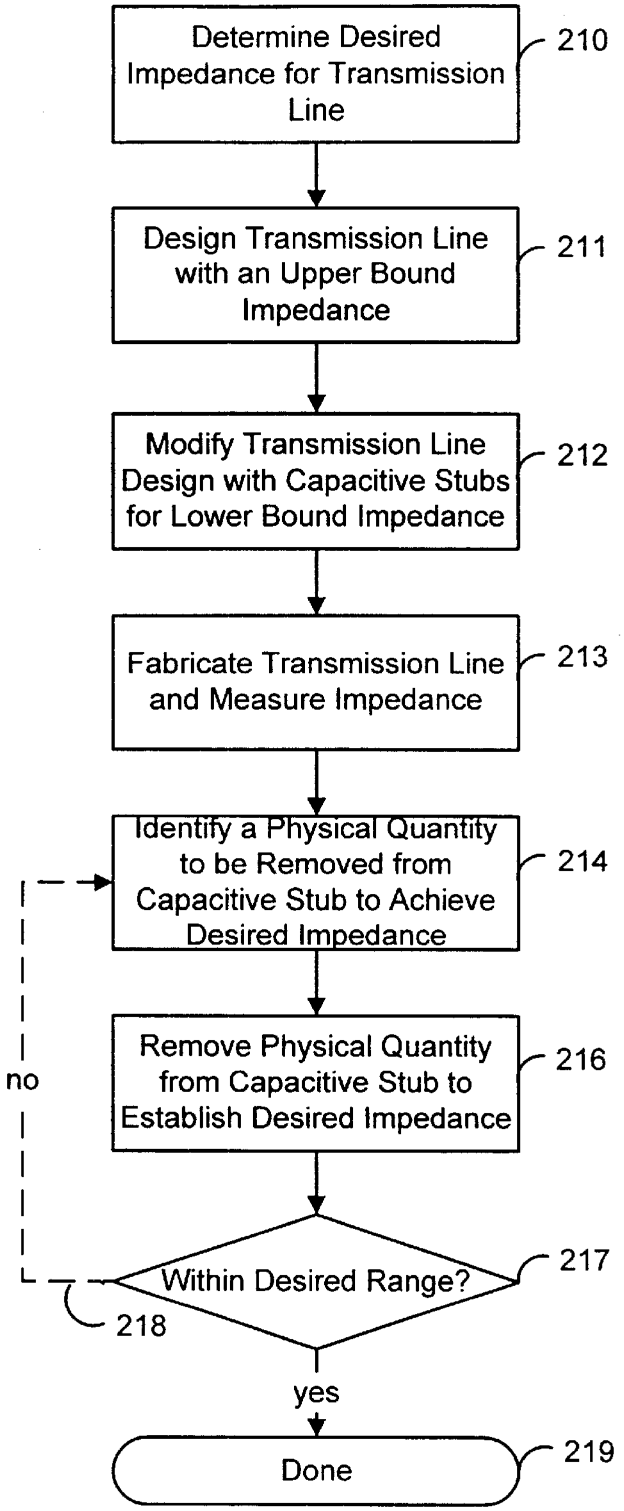
FIG. 3 illustrates processing steps associated with a method of tuning transmission line impedance in accordance with an embodiment of the invention.

FIG. 3 illustrates processing steps associated with the disclosed technique of tuning transmission line impedance. The first processing step shown in FIG. 3 is to determine a desired impedance for a transmission line (step 210). Next, a transmission line design is considered with an upper impedance bound that is higher than the desired impedance for the transmission line (step 211). The designed upper impedance is the upper bound of the tunable impedance range for the desired transmission line. The transmission line design is further modified with capacitive stubs that, when attached, lower the impedance of the designed transmission line to the lower bound of the tunable impedance range for the desired transmission line (step 212). Then, the designed transmission line is fabricated and, preferably, its impedance is measured (step 213). The fabricated line of step 213 will preferably have an impedance that is near the lower bound of the tunable impedance range for the desired transmission line. A physical quantity to be removed from a capacitive stub to achieve the desired impedance is then identified (step 214). The identified physical quantity is then removed from the capacitive stub to establish a desired impedance (step 216). If the measured impedance is within the desired final range (step 217), the transmission line modification is complete (step 219). Otherwise, as indicated with arrow 218, steps 214 and 216 may be repeated to form a measure and trim sequence until the final range or value is achieved.

Figure 4:
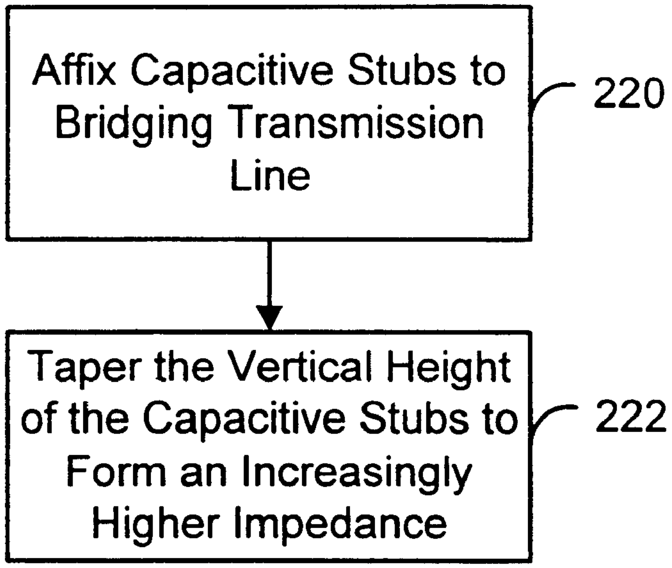
FIG. 4 illustrates processing steps associated with forming an impedance bridge in accordance with an embodiment of the invention.

FIG. 4 illustrates processing steps associated with a method of forming an impedance bridge in accordance with the invention. Initially, capacitive stubs are affixed to a bridging transmission line that has a first end and a second end (step 220). The vertical height of the capacitive stubs is then tapered from the first end to the second end to form an increasingly high impedance between the first end and the second end (step 222).

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An impedance bridging transmission circuit comprising:

a first transmission line having a first impedance;

a second transmission line having a second impedance, wherein the second impedance is greater than the first impedance; and an impedance bridge, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line.

2. The impedance bridging transmission circuit of claim 1, wherein the set of capacitive stubs are sized so that the bridging transmission line has an impedance at the first end corresponding to the first impedance of the first transmission line and so that the bridging transmission line has an impedance at the second end corresponding to the second impedance of the second transmission line.

3. The impedance bridge of claim 2, wherein the sizes of the set of capacitive stubs are tapered from the first end to the second end of the bridging transmission line so as to form an increasingly high impedance on the bridging transmission line from the first end to the second end.

4. An impedance bridge for positioning between a first transmission line having a first impedance and a second transmission line having a second impedance, wherein the second impedance is greater than the first impedance, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line, wherein said set of capacitive stubs is furthermore sized so that the bridging transmission line has an impedance at the first end corresponding to the first impedance of the first transmission line and so that the bridging transmission line has an impedance at the second end corresponding to the second impedance of the second transmission line;

wherein each of the capacitive stubs in the set of capacitive stubs has a width and length that are no larger than one tenth of a wavelength of a signal to be transmitted by the bridging transmission line.

5. The impedance bridge of claim 4, wherein the set of capacitive stubs are positioned along the bridging transmission line, spaced at intervals of distance p, where p is no larger than one tenth of a wavelength of a signal to be transmitted by the bridging transmission line.

6. An impedance bridge for positioning between a first transmission line having a first impedance and a second transmission line having a second impedance, wherein the second impedance is greater than the first impedance, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line, wherein said set of capacitive stubs is furthermore sized so that the bridging transmission line has an impedance at the first end corresponding to the first impedance of the first transmission line and so that the bridging transmission line has an impedance at the second end corresponding to the second impedance of the second transmission line;

wherein the set of capacitive stubs are positioned along the bridging transmission line, spaced at intervals of distance p, where p is no larger than one tenth of a wavelength of a signal to be transmitted by the bridging transmission line.

7. An impedance bridge for positioning between a first transmission line having a first impedance and a second transmission line having a second impedance, wherein the second impedance is greater than the first impedance, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line, and so that the bridging transmission line has an impedance at the first end corresponding to the first impedance of the first transmission line and so that the bridging transmission line has an impedance at the second end corresponding to the second impedance of the second transmission line;

wherein each capacitive stub in the set of capacitive stubs has a width and length that are no larger than one tenth of any wavelength of a signal to be transmitted by the bridging transmission line.

8. An impedance bridge for positioning between a first transmission line having a first impedance and a second transmission line having a second impedance, wherein the second impedance is greater than the first impedance, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line, and so that the bridging transmission line has an impedance at the first end corresponding to the first impedance of the first transmission line and so that the bridging transmission line has an impedance at the second end corresponding to the second impedance of the second transmission line;

wherein each capacitive stub in the set of capacitive stubs has a width and length that are small relative to a wavelength of a signal to be transmitted by the bridging transmission line.

9. An impedance bridge for positioning between a first transmission line having a first impedance and a second transmission line having a second impedance, wherein the second impedance is greater than the first impedance, the impedance bridge comprising:

a bridging transmission line with a first end for connecting to the first transmission line and a second end for connecting to the second transmission line; and a set of capacitive stubs positioned on the bridging transmission line, said set of capacitive stubs sized so that the bridging transmission line has a higher impedance at the second end of the bridging transmission line than at the first end of the bridging transmission line, and so that the bridging transmission line has an impedance at the first end corresponding to the first impedance of the first transmission line and so that the bridging transmission line has an impedance at the second end corresponding to the second impedance of the second transmission line;

wherein each capacitive stub in the set of capacitive stubs has a width and length that are small relative to any wavelength of a signal to be transmitted by the bridging transmission line.

10. A method of forming an impedance bridging transmission circuit, comprising:

providing first transmission line having a first impedance and a second transmission line having a second impedance, wherein the second impedance is greater than the first impedance;

affixing a set of capacitive stubs to a bridging transmission line that has a first end and a second end; and sizing the set of capacitive stubs so that the bridging transmission line has a higher impedance at the second end of the bridging transmission line than at the first end of the bridging transmission line.

11. The method of claim 10, including sizing the set of capacitive stubs so that the bridging transmission line has an impedance at the first end corresponding to the first impedance of the first transmission line and so that the bridging transmission line has an impedance at the second end corresponding to the second impedance of the second transmission line.

12. The method of claim 11, including tapering the sizes of the set of capacitive stubs from the first end to the second end of the bridging transmission line so as to form an increasingly high impedance on the bridging transmission line from the first end to the second end.

13. A method of forming an impedance bridge, comprising the steps of:

affixing a set of capacitive stubs to a bridging transmission line that has a first end and a second end; and tapering the vertical height of said set of capacitive stubs from said first end to said second end to form an increasingly high impedance between said first end and said second end, wherein said tapering step includes removing a capacitive stub positioned next to said second end.

14. The method of claim 13, wherein said tapering step includes the step of removing an increasingly larger portion of each capacitive stub beginning with the first capacitive stub nearest to said first end.

15. A method of forming an impedance bridge between a first transmission line having a first impedance and a second transmission line having a second impedance, wherein the second impedance is greater than the first impedance, comprising:

affixing a set of capacitive stubs to a bridging transmission line that has a first end and a second end;

sizing the set of capacitive stubs so that the bridging transmission line has a higher impedance at the second end of the bridging transmission line than at the first end of the bridging transmission line, and furthermore sizing the set of capacitive stubs so that the bridging transmission line has an impedance at the first end corresponding to the first impedance of the first transmission line and so that the bridging transmission line has an impedance at the second end corresponding to the second impedance of the second transmission line;

wherein each of the capacitive stubs in the set of capacitive stubs has a width and length that are no larger than one tenth of a wavelength of a signal to be transmitted by the bridging transmission line.

16. The method of claim 15, including positioning the set of capacitive stubs along the bridging transmission line spaced at intervals of distance p, where p is no larger than one tenth of a wavelength of a signal to be transmitted by the bridging transmission line.

17. A method of forming an impedance bridge between a first transmission line having a first impedance and a second transmission line having a second impedance, wherein the second impedance is greater than the first impedance, comprising:

affixing a set of capacitive stubs to a bridging transmission line that has a first end and a second end;

sizing the set of capacitive stubs so that the bridging transmission line has a higher impedance at the second end of the bridging transmission line than at the first end of the bridging transmission line, and furthermore sizing the set of capacitive stubs so that the bridging transmission line has an impedance at the first end corresponding to the first impedance of the first transmission line and so that the bridging transmission line has an impedance at the second end corresponding to the second impedance of the second transmission line; and positioning the set of capacitive stubs along the bridging transmission line spaced at intervals of distance p, where p is no larger than one tenth of a wavelength of a signal to be transmitted by the bridging transmission line.

* * * * *